United States Patent
Kitamura

(10) Patent No.: US 6,937,092 B2
(45) Date of Patent: Aug. 30, 2005

(54) AUDIO AMPLIFIER

(75) Inventor: Mamoru Kitamura, Tokyo (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/711,382

(22) Filed: Sep. 15, 2004

(65) Prior Publication Data

US 2005/0017798 A1 Jan. 27, 2005

Related U.S. Application Data

(63) Continuation of application No. 10/725,290, filed on Dec. 2, 2003, which is a continuation of application No. PCT/JP02/06782, filed on Jul. 4, 2002.

(30) Foreign Application Priority Data

Jul. 6, 2001 (JP) ........................................ 2001-205634

(51) Int. Cl.[7] ............................ H03F 3/38; H03F 3/217
(52) U.S. Cl. ........................................ 330/10; 330/251
(58) Field of Search ............................... 330/10, 207 A, 330/251, 297

(56) References Cited

U.S. PATENT DOCUMENTS

| | | | | |
|---|---|---|---|---|
| 5,986,498 A | | 11/1999 | Rodriguez | .................... 330/10 |
| 6,392,476 B1 | | 5/2002 | Rodriguez | .................... 330/10 |
| 6,476,678 B1 | * | 11/2002 | Kolluri et al. | ............... 330/297 |

FOREIGN PATENT DOCUMENTS

| | | |
|---|---|---|
| JP | 07-79120 | 3/1995 |
| JP | 09-130159 | 5/1997 |
| JP | 09-260979 | 10/1997 |

\* cited by examiner

*Primary Examiner*—Steven J. Mottola
(74) *Attorney, Agent, or Firm*—Connolly Bove Lodge & Hutz LLP; Larry J. Hume

(57) ABSTRACT

A transformer 11, which converts input current into voltage output, is arranged between a power switch 1, which amplifies and outputs audio signals based on the power source voltage VDD supplied to MOS transistors Q1 to Q4, and a speaker 3. Through appropriately determining the turns ratio (Ns/Np), without causing the power source voltage VDD of the power switch 1 to be large, large voltage Vs is made to occur at both ends of the speaker 3 from such small power source voltage VDD. Through this, large output power can be obtained.

3 Claims, 2 Drawing Sheets

FIG. 1 (CONVENTIONAL)
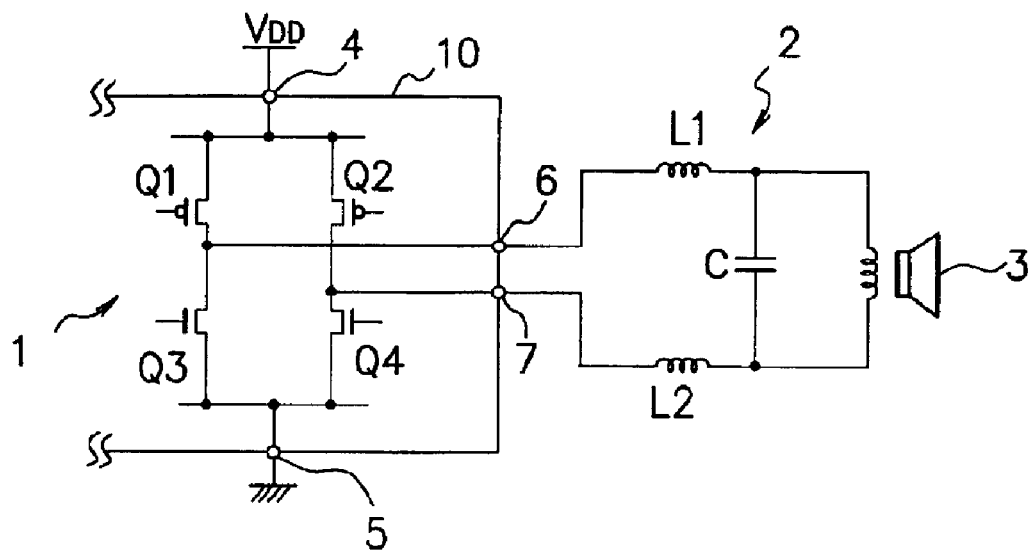

AUDIO AMPLIFIER

CROSS REFERENCE TO RELATED APPLICATIONS

This Application is a Continuation of U.S. application Ser. No. 10/725,290 filed on Dec. 2, 2003. Application Ser. No. 10/725,290 is a Continuation of International Application PCT/JP02/06782 filed on Jul. 4, 2002. International Application PCT/JP02/06782 claims priority to Japanese Application 2001-205634 filed on Jul. 6, 2001. The entire contents of each of these applications is incorporated herein by reference.

BACKGROUND

The present invention relates to an audio amplifier. In particular, it is suitable for use for a digital amplifier (class-D amplifier), which drives a speaker through switching operations of MOS transistors.

The conventional class-A/class-AB amplifiers are known as analog amplifiers. On the other hand, the class-D amplifier is known as a digital amplifier, because such amplifier causes power MOSFET to perform switching operations and causes a speaker to be driven. The power efficiency of the digital amplifier is better than that of the analog amplifiers. Thus, with the backdrop of a demand for miniaturization and low consumption of power for the audio equipment in the recent years, there has been an increase in audio equipment that adopts a digital amplifier.

FIG. 1 is a diagram showing a part of the structures of a conventional digital amplifier. Here, a so-called 1-bit digital amplifier is shown. Differently from the PCM method, which records absolute quantities of quantized data for all sample points, the 1-bit method only records variations from the immediately preceding data as a binary data, and neither thinning out data nor interpolating data is performed as in the PCM method. Thus, a 1-bit signal obtained from quantization shows characteristics quite similar to those of analog. Therefore, a D/A converter is not required, and original analog signals can be reproduced by a simple process which digital signals with high frequency components are removed by the low pass filter arranged at the final stage.

In FIG. 1, "10" denotes an IC chip. Such IC chip 10 integrates the power switch 1, which is composed of a full bridge structure of pMOS transistors Q1, Q2 and nMOS transistors Q3, Q4. pMOS transistors Q1, Q2 are connected to the power source voltage (VDD) outside the chip via the terminal 4. nMOS transistors Q3, Q4 are grounded outside the chip via the terminal 5.

Also, although the illustration is omitted, the IC chip 10 integrates the circuits so as to drive all MOS transistors Q1 to Q4 of the power switch 1. The circuits for such driving include the circuits that perform Delta-sigma Modulation or PWM (Pulse Width Modulation) for input audio signals, and that generate a driving signal having a pulse width in accordance with such audio signal.

All MOS transistors Q1 to Q4 of the power switch 1 perform switching operations based on the driving signal generated by circuits not illustrated in the FIG. That is to say, according to the pulse width of the driving signal, the time in which all MOS transistors Q1 to Q4 are ON is controlled. Through this, the power switch 1 amplifies the audio signal based on the power source voltage VDD for an amount equal to the controlled driving time, and outputs the amplified audio signal.

The audio signal amplified by such power switch 1 is outputted outside the IC chip 10 via the terminal 6 and 7. And such audio signal becomes an analog audio signal through the LPF 2, which is composed of the coils L1, L2, and condenser C, and is outputted from the speaker 3.

Regarding the audio amplifier structured above, in order to obtain large output power (for example, greater than or equal to 10 [W]) in the speaker 3, the power source voltage VDD supplied to the power switch 1 is required to be high. However, in order for this to occur, the voltage tolerant of elements within the IC chip 10 must be sufficiently high. In order to achieve a higher voltage tolerant of elements, a special device must be made in the product process of the Chip 10, and equipment exclusively used for this purpose is required. Thus, there has been a problem in that such matters could not be realized easily.

Moreover, various circuits, in addition to the power switch 1, are integrated within the IC chip 10, and there exist some circuits from among them that operate by low voltage. Thus, when the power source voltage VDD to the power switch 1 becomes higher, the circuits that operate by high voltage and the circuits that operate by low voltage are combined within the IC chip 10. In such cases, a complicated control circuit that combines a control system with high voltage and a control system with low voltage, including a level-shift function, is required. However, the process of combining such control systems with high and low voltages cannot be easily realized. Additionally, the fact that the structure of the IC chip 10 becomes more complicated and larger has been problematic.

The purpose of the present invention is to resolve such problems, and to obtain large output power for the speaker while the power source voltage to the power switch (IC chip) remains low.

BRIEF SUMMARY

An audio amplifier of the present invention comprises amplification means that amplifies and outputs audio signals based on supplied power source voltage, and voltage conversion means that is arranged in the latter stage of the amplification means and that performs voltage conversion from the input voltage to the output voltage.

In another aspect of the present invention, an audio amplifier comprises a power switch for which transistors perform switching operations according to the pulse width of a supplied driving signal, and which amplifies and outputs audio signals based on the power source voltage supplied to the transistors, and a transformer that is arranged in the latter stage of the power switch and that performs voltage conversion based on the signals inputted from the power switch.

In another aspect of the present invention, areas of the transistors that constitute the power switch are formed into necessary sizes in order to input a desired quantity of current into the transformer based on the power source voltage.

In another aspect of the present invention, an audio amplifier further comprises the second power source voltage connected to the transformer, in addition to the power source voltage connected to the power switch. The second power source voltage is larger than the power source voltage.

In another aspect of the present invention, an audio amplifier further comprises two transistors that perform switching operations based on output signals of the power switch, and that input current into the transformer based on the second power source voltage. The two transistors are forced to be driven alternatively.

In another aspect of the present invention, an audio amplifier is structured to drive audio output means though the switching operations of transistors, voltage conversion means that converts input current into voltage output is arranged between amplification means that amplifies and outputs audio signals based on the power source voltage supplied to the transistors and the audio output means.

According to the present invention structured as above, conversion from a small input voltage to a large output voltage is performed by the voltage conversion means created between the amplification means and audio output means, and through this, large output power can be given to the audio output means.

DESCRIPTION OF THE DRAWINGS

FIG. 1 is a diagram showing the structure of a conventional audio amplifier.

DETAILED DESCRIPTION (First Embodiment)

Figure 2:
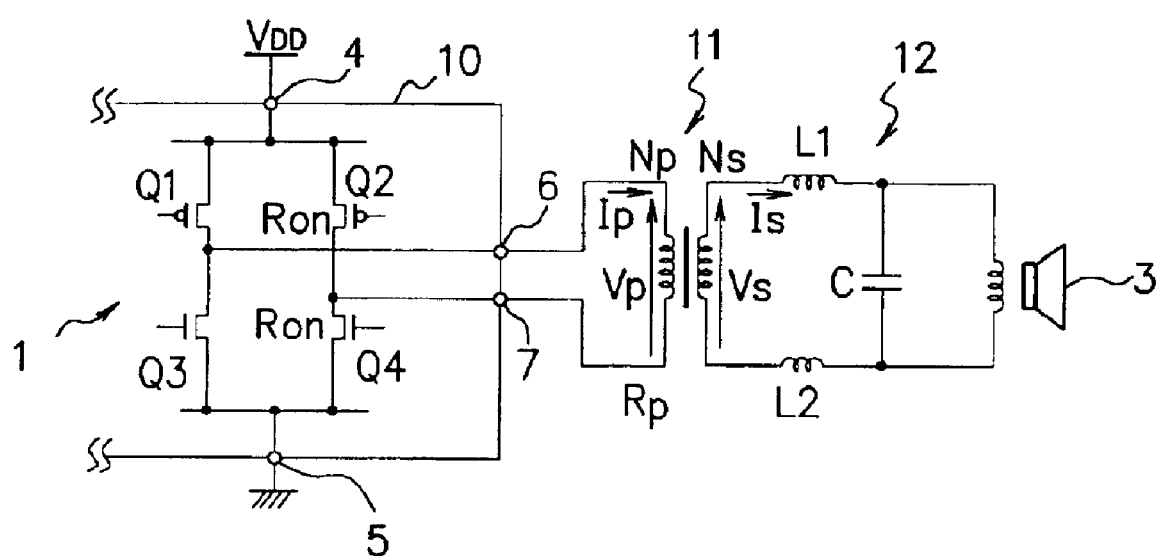
FIG. 2 is a diagram showing the structure of an audio amplifier of the first embodiment.

First, the first embodiment of the present invention is hereinafter explained with reference to the drawing.

FIG. 2 is a diagram showing an example of a part of the structure of the audio amplifier of the first embodiment. In FIG. 2, regarding the elements having the same functions as the elements shown in FIG. 1., the same designations are given thereto.

In FIG. 2, "10" denotes an IC chip. Such IC chip 10 integrates the power switch 1, which is composed of a full bridge structure of pMOS transistors Q1, Q2 and nMOS transistors Q3, Q4. pMOS transistors Q1, Q2 are connected to the power source voltage VDD outside the chip via the terminal 4. nMOS transistors Q3, Q4 are grounded outside the chip via the terminal 5.

Also, although the illustration is omitted, the IC chip 10 integrates the circuits so as to drive all MOS transistors Q1 to Q4 of the power switch 1. The circuits for such driving include the circuits that perform Delta-sigma Modulation or PWM for input audio signals, and that generate a driving signal having the pulse width according to such audio signals.

All MOS transistors Q1 to Q4 of the power switch 1 perform switching operations based on the driving signal generated by circuits not illustrated in the FIG. That is to say, according to the pulse width of the driving signal, the time in which all MOS transistors Q1 to Q4 are ON is controlled. Through this, the power switch 1 amplifies the audio signal based on the power source voltage VDD for an amount equal to the controlled driving time, and outputs the amplified audio signal.

The audio signal amplified by such power switch 1 is outputted outside the IC chip 10 via the terminal 6 and 7. In this embodiment, the transformer 11, which converts the input voltage from the power switch 1 to the desired voltage, is arranged at the output stage of the IC chip 10. The number of turns on the primary side and the number of turns on the secondary side of the transformer 11 are Np and Ns, respectively.

LPF 2, which is composed of the coils L1, L2 and condenser C, is arranged at the output stage of the transformer 11. The signal that is outputted from the power switch 1 and passes through the transformer 11 becomes an analog audio signal through the LPF 2, which is outputted from the speaker 3.

As shown in FIG. 2, in this embodiment, the transformer 11 is arranged between the power switch 1 and the speaker 3, high voltage is obtained through the transformer 11 from the low power source voltage VDD that is provided to the power switch 1, and a larger power can be outputted to the speaker 3.

Now, hypothetically, the current flowing into the coil on the primary side of the transformer 11 is Ip, the current flowing into the coil on the secondary side thereof is Is, the voltage occurring at both ends of the primary coil is Vp, and the voltage occurring at both ends of the secondary coil is Vs. At this point, $$Np \cdot Ip = Ns \cdot Is \tag{1}$$

$$Ns/Np = Vs/Vp \tag{2}$$

are established.

Based on the above formula (1), the current Ip is as formula (3).

$$Ip = (Ns/Np) \cdot Is \tag{3}$$

Also, in case that the resistance values of the coils L1 and L2 are almost 0 [$\Omega$], if the power PR is supplied to load R of the speaker 3, the current Is must be indicated as formula (4).

$$Is = Vs/R \tag{4}$$

Additionally, based on the above formula (2), the following formula (5) is applied.

$$Vs = Vp(Ns/Np) \tag{5}$$

Based on the above formula (5), the power PR that is supplied to load R is as follows.

$$PR = Vs^2/R = Vp^2(Ns/Np)^2/R \tag{6}$$

For instance, in case that a resistance value of the load R is 4[$\Omega$], if it is desired to output the power PR of 10[W], the necessary value as the voltage Vs occurring at both ends of the secondary coil of the transformer 11 is as follows based on the above formula (6).

$$Vs = (PR \cdot R)^{1/2} = (10 \times 4)^{1/2} \approx 6.32[V]$$

At this time, according to the above formula (4), the current Is of the secondary coil is required to be:

$$Is = Vs/R = 6.32/4 = 1.58[A]$$

Also, if the power source voltage supplied to the power switch 1 is VDD, ON-state resistances of MOS transistors Q1, Q2 are Ron, and the direct current resistance of the primary coil of the transformer 11 is Rp, the voltage Vp occurring at both ends of the primary coil is shown as follows.

$$Vp = VDD - (Ron + Rp) \times Ip \tag{7}$$

Here, the direct current resistance Rp is assumed to be almost 0 [$\Omega$].

As understood based on the formula (7), if the power source voltage VDD is 5 [V], the voltage Vp of the primary coil will not be more than 5 [V]. Thus, the ratio for the minimum number of turns of the transformer 11 is as follows based on the formula (2).

$$Ns/Np = Vs/Vp = 6.32/5 = 1.264$$

In such case, the current Ip of the primary coil is as follows based on the formula (3).

$$Ip = (Ns/Np) \cdot Is = 1.264 \times 1.58 \approx 2[A]$$

This is to say, the input power from the primary coil of the transformer 11 is 5 [V] ×2 [A]=10 [W], and the power supply for the load R is also 10 [W]. When the efficiency of power conversion is 100%, this is possible. However, since ON-state resistances Ron of MOS transistors Q1, Q2 exist as a matter of fact, the voltage Vp of the primary coil becomes lower than 5 [V] of the power source voltage VDD. Thus, the turns ratio of the transformer 11 is required to be larger than 1.264. The size of the turns ratio that will be applied depends on the relationship between the current Is of the secondary coil and ON-state resistance Ron.

As described above, for example, in case that ON-state resistances Ron of MOS transistors Q1, Q2 are larger than or equal to several [Ω], even if the turns ratio of the transformer 11 is made to be quite large, the current Ip of the primary coil cannot be large. Thus, the voltage Vp of the primary coil does not rise, which causes the voltage Vs of the secondary coil not to rise. Thus, a large current Is of about 1.58 [A] cannot be flowed to the secondary coil.

On the other hand, in case that ON-state resistances Ron of MOS transistors Q1, Q2 are 0.1 [Ω], which is sufficiently small, if the current Ip of the primary coil is assumed to be 3 [A], the voltage Vp of the primary coil is as follows based on the formula (7).

$$Vp=5[V]-(0.1[\Omega]\times2)\times3[A]=4.4[V]$$

As mentioned above, since 6.32 [V] is required regarding the voltage Vs of the secondary coil, the turns ratio of the transformer 11 is as follows based on the formula (2).

$$Ns/Np=Vs/Vp=6.32/4.4\approx1.44$$

In such case, the current Is of the secondary coil is 1.58 [A]. Thus, the current Ip of the primary coil is as follows based on the formula (3).

$$Ip=(Ns/Np)\cdot Is=1.44\times1.58\approx2.28[A]$$

As such, since the actually required current Ip=2.28 [A] is smaller than the assumed current Ip=3[A], operation is possible. Thus, in case that the source power voltage VDD is 5 [V], unless ON-state resistances Ron of MOS transistors Q1, Q2 are made to be sufficiently small to the extent of 0.1 to 0.2 [Ω], even if the transformer 11 is used, large output power cannot be supplied to the load R for which resistance value is 4 [Ω].

In order to cause the ON-state resistances Ron of MOS transistors Q1, Q2 to be small, the areas of the MOS transistors Q1, Q2 may possibly be large. In addition, by causing the areas of the MOS transistors Q1, Q2 to be large, the area of the IC chip 10 will increase in accordance with that amount. However, differently from the previous method for which a high level of power was obtained by causing the power source voltage VDD of the power switch 1 to be of a higher level than 5 [V] without using the transformer 11, neither a special device for use in the process in order to cause the high voltage tolerant of elements to become large, nor the preparation of a complicated control circuit for the power system within the IC chip 10 is necessary. Therefore, the circuits within the IC chip 10 are more simplified than in the previous method, and the entire chip area will not be large.

In addition, the transformer 11 of this embodiment passes a high speed pulse signal, differently from the previous transformer that passes a low frequency analog signal by a power amplifier using vacuum tubes. Thus, the size can be small.

As stated above, according to this embodiment, causing the ON-state resistances Ron to be small by making the areas of MOS transistors Q1, Q2 to be larger as well as preparing the transformer 11 can result in a large level of output power PR at the speaker 3 from the small power source voltage VDD of the IC chip 10. In doing so, only changing the turns ratio of the transformer 11 can result in the desired large level of output power PR.

(Second Embodiment)

Figure 3:
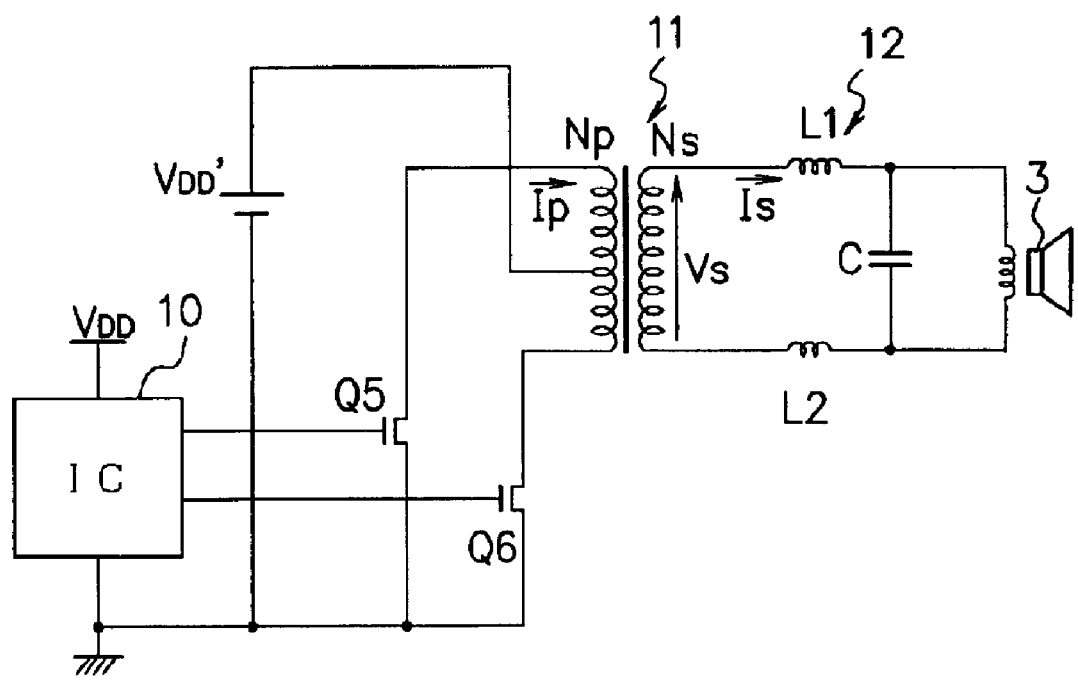
FIG. 3 is a diagram showing the structure of an audio amplifier of the second embodiment.

Next, the second embodiment of the present invention is hereinafter explained based on the drawing. FIG. 3 is a diagram representing an example of a structure of the audio amplifier of the second embodiment. In FIG. 3, for the elements having the same functions as the elements shown in FIG. 2., the same designations are given thereto.

FIG. 3 does not illustrate the internal structure of the IC chip 10. However, the power switch 1 is arranged in the IC chip 10 in the same manner as in FIG. 2. Signals outputted from the power switch 1 are provided to the gates of two nMOS transistors Q5 and Q6, which are arranged outside the IC chip 10. Both sources of nMOS transistors Q5, Q6 are grounded, and each drain is connected to both ends of the primary coil of the transformer 11.

In this embodiment, separately from the power source voltage VDD to the power switch 1, the second power source voltage VDD' is prepared. This is connected to an appropriate position (for example, an intermediate position) of the primary coil of the transformer 11. The value of the second power source voltage VDD' is set as being larger than the power source voltage VDD. For example, the power source voltage VDD may be 5 [V], and the second power source voltage VDD' may be 12 [V].

The two above nMOS transistors Q5, Q6 perform switching operations based on the pulse signal outputted from the power switch 1, and alternately become ON. Through this, the current is alternately inputted to the transformer 11 based on the second power source voltage VDD'.

A method is possible where a single MOS transistor is connected to the output stage of the power switch 1, and the current is supplied to the transformer 11 by driving such single transistor. However, as shown in FIG. 3, preparing two nMOS transistors Q5, Q6 and supplying the current such that one of them is OFF while another is ON can improve the efficiency of the voltage conversion of the transformer 11.

According to the structure shown in FIG. 3 above, without causing the areas of such MOS transistors Q1, Q2 to be large in order to cause ON-state resistances of MOS transistors Q1, Q2 which constitute the power switch 1 to be small, based on the second power source voltage VDD' of a larger level than the power source voltage VDD of the power switch 1, the larger current Ip is supplied to the primary coil of the transformer 11, and large output power Vs can be obtained. Also, in order to obtain large output voltage Vs, no large turns ratio of the transformer 11 is necessary.

Furthermore, since the power source voltage VDD of the IC chip 10 remains low, neither a special device for use in the process in order to cause the high voltage tolerant of elements to become large, nor the preparation of a complicated control circuit for the power system within the IC chip 10 is necessary. Therefore, the circuits within the IC chip 10 are more simplified compared with the previous method where the power source voltage VDD itself to the IC chip 10 has been large, and the entire chip area will not be large.

Moreover, since nMOS transistors Q5 and Q6, which supply the current Ip to the primary coil of the transformer 11 based on the second power source voltage VDD', are arranged outside the IC chip 10, the structure of nMOS transistors Q5, Q6 can be freely possible without being restricted to the circuit area of the IC chip 10. Therefore, the areas of such nMOS transistors Q5, Q6 are made to be large, and the ON-state resistances thereof become small. Through this, a larger level of current Ip can be supplied to the primary coil of the transformer 11, and larger output power can be obtained.

In addition, in all of the above embodiments, the transformer 11 has been used as a structure to obtain a large output voltage Vs from the low power source voltage VDD of the IC chip 10. However, if the circuit is allowed to perform the same level shift (pressure up, etc.), such circuit can be applied in lieu of the transformer 11. However, using the transformer 11 has merit in that a simple adjustment involving only a change of the turns ratio can result in output power of the desired size.

Moreover, in the second embodiment above, although two nMOS transistors Q5, Q6 are used as the MOS transistors outside the IC chip 10, it is possible to use two pMOS transistors. Also, it is possible to use a single nMOS transistor and a single pMOS transistor.

In addition, the embodiments explained above have shown only one example of the possible incarnations upon implementing the present invention. This should not cause the technical scope of the present invention to be restrictively interpreted. This is to say, the present invention can be implemented in various forms without deviating from the spirit or the main characteristics thereof.

As explained in detail above, according to the present invention, the voltage conversion means is arranged between the amplification means that amplify and output the audio signal based on the power source voltage supplied to the transistors and audio output means. Thus, without causing the source voltage supplied to the above transistors to be large, a large output power can be obtained at the audio output means from such small power source voltage.

Also, when transformer is used as the above voltage conversion means, a simple adjustment involving only a change of the turns ratio can result in output power of the desired level.

Moreover, when the area of the above transistors is large, such ON-state resistances are made to be small, and a large current can flow into the transformer. As a result of this, even if the turns ratio of the transformer becomes large, a large output power can be obtained at the audio output means from the small power source voltage to the above transistors.

And, in addition to the power source voltage connected to the above amplification means, a second power source voltage connected to the above voltage conversion means is prepared. When the second power source voltage is larger than the power source voltage, a large level of power can be obtained from the small power source voltage for the amplification means, without causing the power source voltage connected to the above amplification means to be large, causing the area of the transistors of the amplification means to be large in order to make ON-state resistances smaller, or causing the turns ratio of the transformer to be large.

The present invention is useful in that large output power can be obtained for the speaker, while the power source voltage for the power switch (IC chip) remains low.

What is claimed is:

1. An audio amplifier, comprising:
   a power switch comprising transistors which perform switching operations according to a pulse width of a supplied driving signal, and which amplify and output audio signals by using a first power source voltage supplied to said transistors; and
   a transformer arranged in a latter stage of said power switch which performs a voltage conversion based on the audio signals supplied by said power switch by using a second power source voltage,
   wherein said first power source voltage and said second power source voltage are different from each other, and an output voltage provided by the transformer is greater than the first power source.

2. The audio amplifier of claim 1, wherein areas of said transistors comprising said power switch are selected to allow a desired quantity of current into said transformer based on said first power source voltage.

3. An audio amplifier structured to drive an audio output means though plural switched transistors, the amplifier comprising:
   voltage conversion means for converting an input current into an voltage output based on a second power source voltage arranged between amplification means for amplifying and outputting audio signals based on a first power source voltage supplied to said plural switched transistors and said audio output means,
   wherein said second power source voltage is different from said first power source voltage, and said output voltage is greater than the first power source voltage.

* * * * *